United States Patent
Irscheid et al.

(10) Patent No.: US 7,315,208 B2
(45) Date of Patent: Jan. 1, 2008

(54) METHOD FOR IMPROVING THE OUTPUT POWER OF A NON-LINEAR POWER AMPLIFIER

(75) Inventors: Otmar Irscheid, Hawalli (KW);
Andreas Langer, Unterschleissheim-Lohhof (DE);
Michael Menge, München (DE)

(73) Assignee: Siemens Aktiengesellschaft, Munich (DE)

( * ) Notice: Subject to any disclaimer, the term of this patent is extended or adjusted under 35 U.S.C. 154(b) by 195 days.

(21) Appl. No.: 10/544,595

(22) PCT Filed: Aug. 28, 2003

(86) PCT No.: PCT/DE03/02867

§ 371 (c)(1),
(2), (4) Date: Aug. 4, 2005

(87) PCT Pub. No.: WO2004/070943

PCT Pub. Date: Aug. 19, 2004

(65) Prior Publication Data

US 2006/0145759 A1  Jul. 6, 2006

(30) Foreign Application Priority Data

Feb. 4, 2003 (DE) ................... 103 04 456

(51) Int. Cl.
*H03F 1/26* (2006.01)
(52) U.S. Cl. ....................................... 330/149
(58) Field of Classification Search .............. 455/114.3
See application file for complete search history.

(56) References Cited

U.S. PATENT DOCUMENTS

| 5,049,832 A | 9/1991 | Cavers ......................... 330/149 |
| 6,985,033 B1 * | 1/2006 | Shirali et al. ................ 330/149 |
| 2002/0027474 A1 | 3/2002 | Bonds ......................... 330/149 |

FOREIGN PATENT DOCUMENTS

| EP | 0 967 717 | 12/1999 |
| EP | 1 162 734 | 12/2001 |

* cited by examiner

*Primary Examiner*—Steven J. Mottola
(74) *Attorney, Agent, or Firm*—Bell, Boyd & Lloyd LLP

(57) ABSTRACT

A method for improving the output power of a non-linear amplifier, wherein signal amplitudes of a digital baseband are predistorted and then fed at the input of the power amplifier, having a non-linear characteristic curve, in order to linearize the characteristic curve. The signal amplitudes are fed to the input of the power amplifier in a predistorted manner up to a predetermined transition power while being fed to the input of the power amplifier in a non-predistorted manner from the predetermined transition power on.

4 Claims, 5 Drawing Sheets

METHOD FOR IMPROVING THE OUTPUT POWER OF A NON-LINEAR POWER AMPLIFIER

FIELD OF TECHNOLOGY

The present disclosure relates to a method for improving the output power of a non-linear power amplifier (PA), with signal amplitudes of a digital baseband being predistorted and then injected at the input of the power amplifier, which has a non-linear characteristic amplifier curve, in order to linearize the characteristic amplifier curve (i.e., predistortion).

BACKGROUND

In many areas, such as in multimode mobile telephones, a linear signal amplification with high power efficiency is needed. One option for achieving a linear signal amplification is to linearize a non-linear power amplifier which thus exhibits a non-linear characteristic curve, by injecting a predistorted signal. This amplification process is known as predistortion. The combination of the predistorted injected signal and the non-linear characteristic amplifier curve produces overall a linear characteristic curve of the power amplifier and thereby a linear signal amplification.

A problem with this method of amplification is that only the signal quality is improved with particular regard to linearity. The output power and the efficiency have not been able to be increased thus far with this linear signal amplification by the predistortion.

SUMMARY

Accordingly, the present disclosure provides a method under an exemplary embodiment that allows an increase in the output power and also an increase in the efficiency of a non-linear power amplifier and simultaneously achieves a good signal quality.

Amplification procedures that use predistortion, which have previously having been used for complete linearization of a non-linear characteristic amplifier curve, can also be used by modifying them for variable formation of the characteristic curve of the power amplifier.

Accordingly, an exemplary method is disclosed for improving the output power of a non-linear power amplifier (PA), in which signal amplitudes of a digital baseband are predistorted and then injected at the input of the power amplifier which has a non-linear characteristic amplifier curve in order to linearize the amplifier curve (predistortion). The signal amplitudes are injected predistorted to a predetermined transition power into the input of the power amplifier, and from this predetermined transition power, the signal amplitudes are injected non-predistorted into the input of the power amplifier.

This configuration makes it possible for the non-linear characteristic amplifier curve to be only partly linearized. As such, this part linearization increases the power and the efficiency of the amplifier compared to the power at full linearization. The part linearization minimally reduces the signal quality, but in return it makes it possible for the procedure to set the range of the linearity so that the signal quality is sufficiently good.

It is also beneficial for the transition power, at which the amplifier characteristic curve moves from a linear area into a non-linear area, to be set. The linear area is designated as the area of the amplifier characteristic curve in which the output power is directly proportional to the input power.

By setting the transition power, the linearity of the signal can be increased or reduced. This makes it possible to vary the signal quality with respect to the linearity. This allows an optimum amplifier range to be set in which the minimum required signal quality and at the same time the maximum output power of the amplifier are achieved.

If, for example, the transitional power is reduced, this also reduces the linear area of the characteristic amplifier curve and thereby the signal quality, with the output power of the amplifier characteristic curve being increased in this area. If, on the other hand, the transitional power is increased, the linear area of the amplifier characteristic curve is also expanded and the signal quality thereby improved, with the output power of the amplifier characteristic curve simultaneously being reduced in this area. If the transitional power is set to the value of the maximum input power of the amplifier, a linearized characteristic curve is obtained.

Under a preferred embodiment, look-up table is used to apply predistortion to the signal amplitudes up to the predetermined transitional power and to inject the signal amplitudes as from this predetermined transitional power into the input of the amplifier. Predistortion factors are stored In the look-up table which predistort the small to medium signal amplitudes and inject the large signal amplitudes undistorted into the input of the amplifier.

BRIEF DESCRIPTION OF THE DRAWINGS

The various objects, advantages and novel features of the present disclosure will be more readily apprehended from the following Detailed Description when read in conjunction with the enclosed drawings, in which.

DETAILED DESCRIPTION

Figure 1:
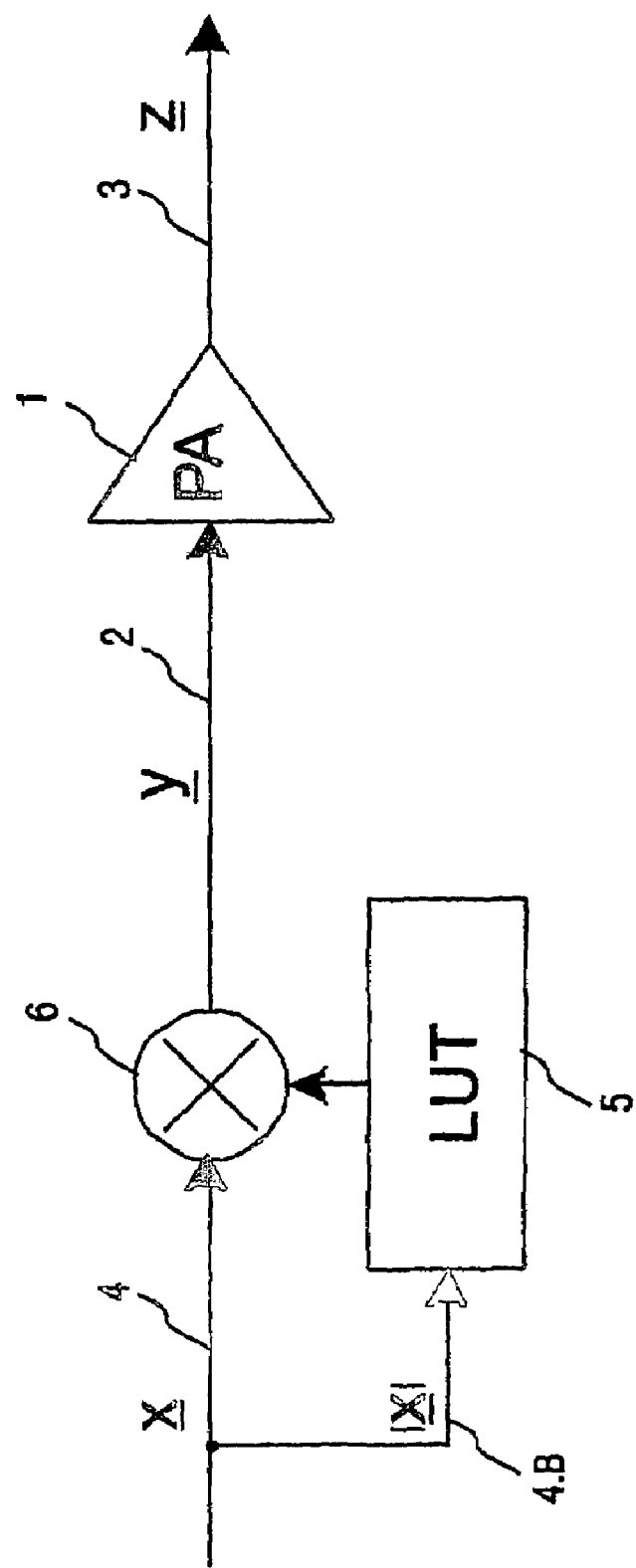
FIG. 1 illustrates a circuit diagram of a Complex Gain Digital Predistortion amplifier that utilizes predistortion with a complex multiplier.

FIG. 1 illustrates a basic diagram of how, with the aid of the method in accordance with the invention, the power and the efficiency of a power amplifier PA 1 can be increased.

With the aid of a look-up table 5, the complex I/Q signals 4 of the baseband, indicated by the arrow $\underline{x}$, are multiplied by a complex multiplier 6 with different predistortion factors. Viewed mathematically, after the complex multiplier 6 the complex envelope of the signal 2, indicated by the arrow $\underline{y}$ is obtained as follows:

$$\underline{y} = LUT(|\underline{y}|) \cdot \underline{x}$$

The contribution of the complex I/Q Signal of the baseband 4.B, indicated by the arrow |x|, is thus multiplied by the various predistortion factors of the look-up table 5 and then with the complex I/Q signal of the baseband 4, indicated by the arrow x. The complex envelopes of the signal 2, indicated by the arrow y, are injected at the input of the power amplifier PA 1. For example a W-CDMA (Wideband Code Division Multiple Access) signal can be used as a signal. The predistortion allows the output signal of the line amplifier 3 available at the output of the power amplifier PA 1, indicated by the arrow z, to be varied as regards its linearity curve. In which case the complex envelope of the signal 3 arrow z is produced at the output of the amplifier PA 1 as follows $$\underline{z} = \underline{Gain}_{PA}(|Y|) o \; \underline{y}$$

This can be implemented overall by the combination of predistorted signals and non-linear amplifier characteristic curves. This combination produces a linear signal curve. Different amplifier characteristic curves are shown in FIG. 2.

Figure 2:
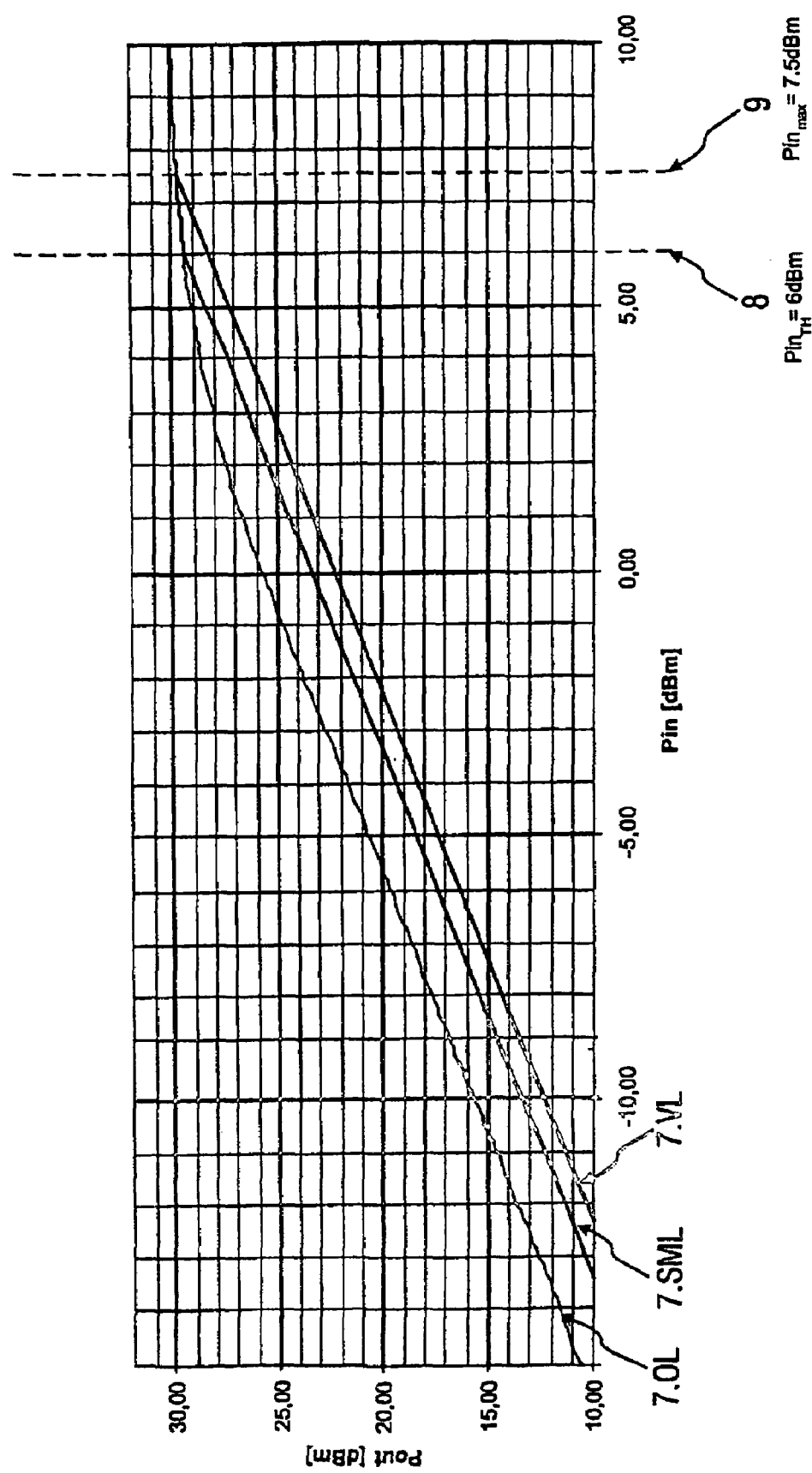
FIG. 2 is a characteristic transformer curve for different linearizations of the amplifier of FIG. 1, in which the output power is plotted against input power.

FIG. 2 in which different characteristic amplifier curves are depicted with different linearization. On the abscissa of the diagram the input power Pin in [dBm] is plotted, with the abbreviation in square brackets standing for decibels in relation to one Milliwatt. On the ordinate the output power Pout is plotted, also in [dBm]. Three characteristic curves with three different signal linearizations are shown in the exemplary embodiment.

The topmost curve of FIG. 2 shows a characteristic amplifier curve 7.OL without linearization. In the area of Pin: −15 [dBm] to circa 1 to 2 [dBm] this curve exhibits a linear behavior, meaning that the input power Pin is proportional to the output power Pout. In the area of Pin:2 [dBm] up to a maximum input power 9 $Pin_{max}$: 7.5 [dBm] the behavior of the characteristic amplifier curve 7.OL is no longer linear. The entire curve corresponds to a non-linear characteristic amplifier curve for which no predistorted signal is injected.

The lowest curve shows a characteristic amplifier curve 7.VL which has been completely linearized. The shape of this characteristic amplifier curve 7.VL is linear in the area of the input power of Pin: circa −12 [dBm] up to a maximum input power 9 Pinmax: 7.5 [dBm]. This linearization of a non-linear characteristic amplifier curve 7.OL is achieved by the injection of a predistorted signal. In this case however, no increase of the output power can be achieved by signal predistortion. It can be clearly seen from the diagram that the characteristic amplifier curve 7.VL over the entire area of approx. −15 [dBm] to 7.5 [dBm] runs below the characteristic amplifier curve 7.OL. The output power Pout of the characteristic amplifier curve 7.VL is thus lower than the output power of the characteristic amplifier curve 7OL. However this complete linearization of the characteristic amplifier curve 7.VL optimizes the signal quality.

The center curve shows a characteristic amplifier curve which has been linearized in accordance with the presently disclosed method and is only partly linearized 7.SML. This partial linearization, also known as Signal Matched Linearization, enables the output power Pout and the efficiency of a power amplifier to be increased over the entire range of the input power Pin. To only partly linearize the characteristic amplifier curve a look-up table is only used as from a specific input power Pin, namely the transition power 8 $Pin_{TH}$ (6 [dBm] in FIG. 2). This means that as from this transition power 8 $Pin_{TH}$ entries are present in the look-up table which multiply the signal amplitudes of the signal which are injected into the power amplifier by a factor of 1. The linearization of the characteristic amplifier curve is suppressed by these entries in the look-up table. This can be clearly seen from the shape of the characteristic amplifier curve 7.SML in the area $Pin_{TH}$: 6 [dBm] to $Pin_{max}$: 7.5 [dBm]. In this area the characteristic amplifier curve 7.SML is no longer linear. Although this partial suppression of the signal linearization minimally reduces the signal quality and thereby the linearity of the characteristic amplifier curve, the output power Pout is however significantly increased compared to a completely linearized characteristic amplifier curve 7.VL. This power increase can be seen from the shape of the characteristic amplifier curve 7.SML. The characteristic amplifier curve 7.SML thus extends over the entire input power range of Pin: approx. −13 [dBm] to $Pin_{max}$: 7.5 [dBm] above the characteristics of amplifier curve 7.VL. The gap between the two characteristic amplifier curves in the diagram corresponds to the power increase in [dBm].

Figure 3:
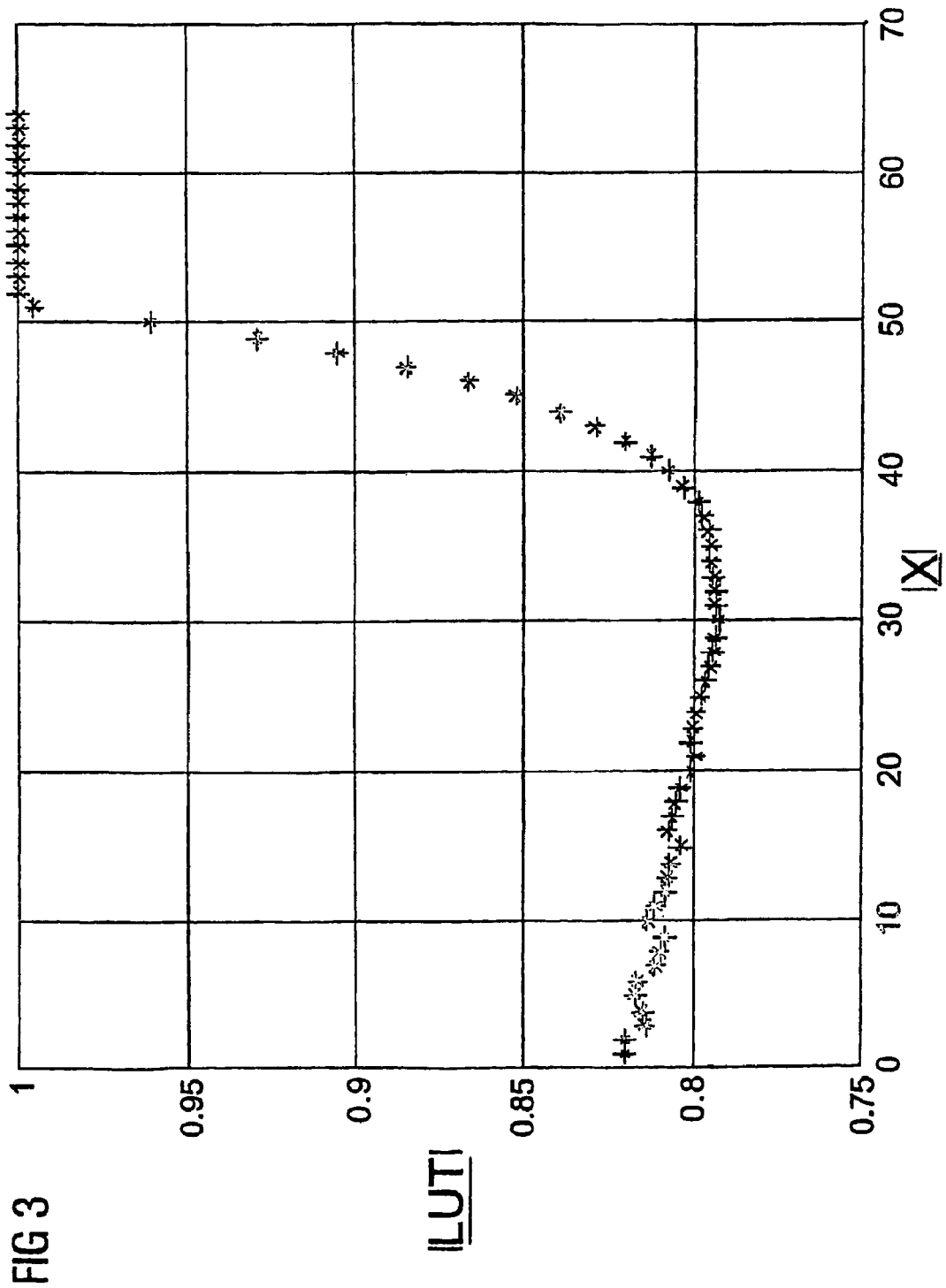
FIG. 3 is a graphically plotted look-up table with values of the predistortion factors.

FIG. 3—graphically depicts the values of a look-up table under the exemplary embodiment. In this graph the contributions of the complex I/Q signal of the baseband 4.B are plotted on the abscissa. The associated predistortion factor is plotted on the ordinate. Between the points 0 to 51 of the look-up table the predistortion factors are less than 1. From the points 52 to 64 the predistortion factor is set to 1. Thus, from point 52 onwards, the signal is no longer predistorted. This "multiplication by 1" occurs in the curve 7.SML from FIG. 2 as from an input power Pin of 6 [dBm].

Figure 4:
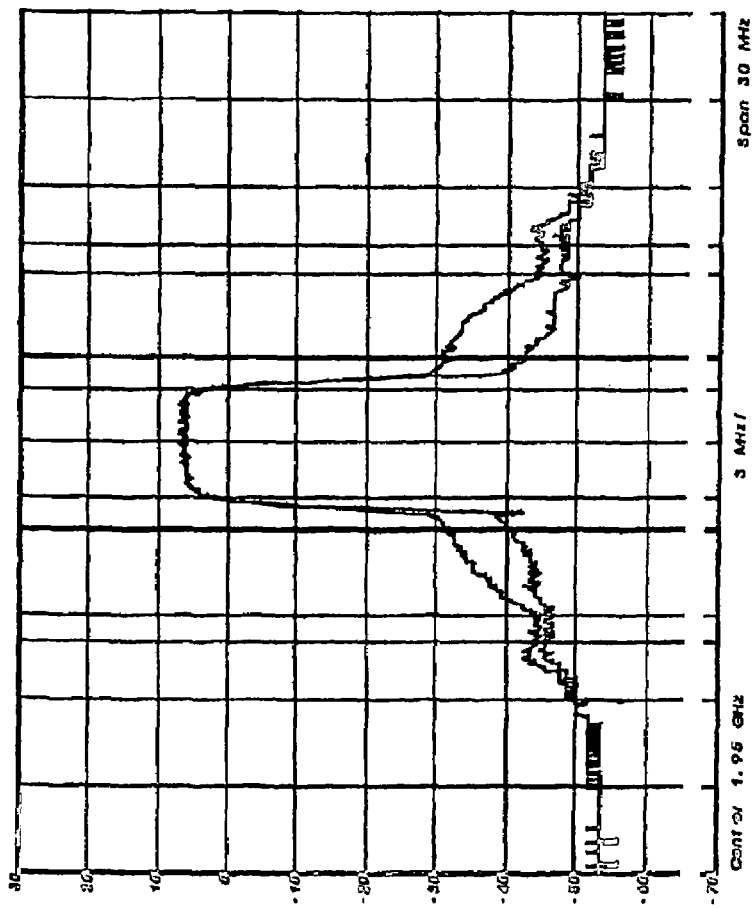
FIG. 4 is a diagram in which the output power is plotted against the frequency with complete predistortion and with no predistortion of the signal, and a table which contains the measured values for the output power ACLR (ACLR low and ACRL up) and the efficiency n for the case of complete predistortion and no predistortion.

FIG. 4 illustrates two measured curves under the exemplary embodiment, depicting the output power plotted against the frequency, with one curve showing no predistortion and one curve showing complete predistortion of the signal respectively. The upper curve of the two curves shows a measurement taken without predistortion. The lower curve shows a measurement taken with predistortion.

In the lower part of FIG. 4, measured values for both curves are given in a table. The measured values for the output power Pout, ACLR low and ACLR up and the efficiency n are shown for the case of complete predistortion and that of no predistortion in lines two and three of the table. The output power Pout and ACLR can be taken from the spectrum. The value for the efficiency n has been determined from the ratio of the output power Pout to the product of power consumption and voltage needed. It can be seen from the table that the output power Pout and the efficiency n remain almost the same with and without predistortion. Only the ACLR has been able to be improved by the predistortion.

Figure 5:
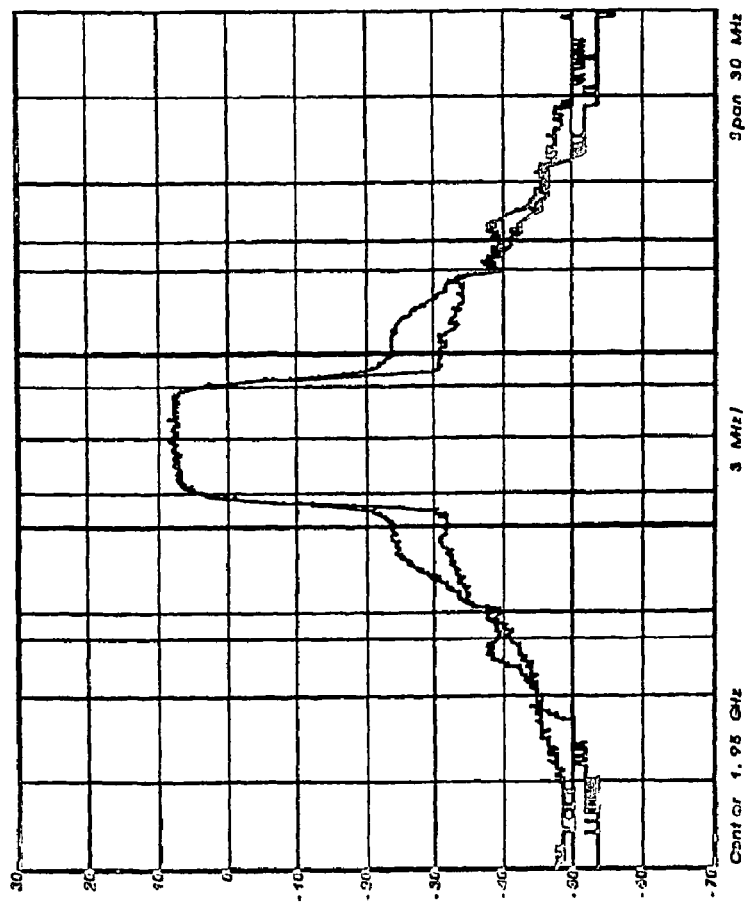
FIG. 5 is a diagram in which the output power is plotted against the frequency with partial predistortion and with no predistortion and a table which contains measured values for the output power ACLR and the efficiency for the case of complete and partial predistortion.

FIG. 5 illustrates two measured curves which depict the output power Pout plotted against the frequency with no predistortion and with partial predistortion of the signals under the exemplary embodiment. The upper of the two curves shows a measurement taken without predistortion. The lower curve shows a measurement taken with partial predistortion.

Like FIG. 4, measured values for the two curves are shown in the table at the bottom of FIG. 5. The measured values for the output power Pout, ACLR low and ACLR up and the efficiency n are shown for the case of complete predistortion and that of no predistortion in lines two and three of the table. If the measured values from the Table in FIG. 4 are compared to the measured values from the table in FIG. 5, it can be seen that the output power Pout with partial predistortion amounts to 27.75 [dBm] and has thus increased in comparison to the output power without predistortion Pout, which amounts to 26.45 [dBm] (value from Table 1 of FIG. 4). An increase in the output power Pout has thus been achieved by a partial predistortion. This also means that the efficiency n of the amplification has been increased by partial predistortion. From the table of FIG. 4 a value of n=43.2 percent is produced for the efficiency without predistortion. From the table of FIG. 5, a value of n=50.2 percent is produced for the efficiency with predistortion.

It should be noted that the value of the output power Pout without predistortion can be manually increased so that the ACLR value can be obtained for the same output power.

Overall a method is thus presented by the invention which uses a partial linearization of non-linear power amplifiers with predistortion and, in addition to linear signal amplification, makes it possible to increase the output power and also increase the efficiency of a power amplifier.

It should be understood that various changes and modifications to the presently preferred embodiments described herein will be apparent to those skilled in the art. Such changes and modifications can be made without departing from the spirit and scope of the present disclosure and without diminishing its intended advantages. It is therefore intended that such changes and modifications be covered by the appended claims.

The invention claimed is:

1. A method for improving the output power of a non-linear power amplifier comprising:

predistorting signal amplitudes of a digital baseband; and injecting the signal amplitudes at an input of the power amplifier, wherein the signal amplitudes are injected predistorted up to a predetermined transition power and, from the predetermined transition power, the signal amplitudes are injected non-predistorted into the input of the power amplifier.

2. The method according to claim 1, wherein the signal amplitudes injected at the input of the power amplifier are predistorted in such a way that the transition power is set, with a linear part of the amplifier making the transition to a non-linear part at this transition power.

3. The method according to claim 2, wherein a signal quality of the power amplifier is adapted by setting the transition power.

4. The method according to claim 1, wherein a look-up table is used to predistort the signal amplitudes up to the predetermined transition power and to inject the signal amplitudes non-predistorted into the input of the amplifier as from the predetermined transition power.

* * * * *